(12) United States Patent
Wang

(10) Patent No.: US 11,856,863 B2
(45) Date of Patent: Dec. 26, 2023

(54) METHOD OF FORMING A SEMICONDUCTOR MEMORY DEVICE WITH REMAINING UPPER ELECTRODE LAYER COVERING ONLY LOGIC CIRCUIT REGION ON MAGNETIC TUNNELING JUNCTION STACK LAYER

(71) Applicant: UNITED MICROELECTRONICS CORP., Hsin-Chu (TW)

(72) Inventor: Hui-Lin Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 335 days.

(21) Appl. No.: 17/343,768

(22) Filed: Jun. 10, 2021

(65) Prior Publication Data

US 2022/0376173 A1 Nov. 24, 2022

(30) Foreign Application Priority Data

May 18, 2021 (CN) .......................... 202110538653.5

(51) Int. Cl.
*H10N 50/01* (2023.01)
*H10B 61/00* (2023.01)
*H10N 50/10* (2023.01)
*H10N 50/85* (2023.01)

(52) U.S. Cl.
CPC ............. *H10N 50/01* (2023.02); *H10B 61/00* (2023.02); *H10N 50/10* (2023.02); *H10N 50/85* (2023.02)

(58) Field of Classification Search
CPC ......... H10N 50/01; H10N 50/85; H10B 61/00
See application file for complete search history.

(56) References Cited

U.S. PATENT DOCUMENTS

| 2017/0200723 A1* | 7/2017 | Lee ..................... H01L 29/0649 |
| 2018/0198059 A1* | 7/2018 | Ko ..................... H01L 23/5226 |
| 2019/0081233 A1* | 3/2019 | Lee ......................... H10N 50/01 |
| 2020/0135806 A1* | 4/2020 | Peng ..................... G11C 11/161 |
| 2020/0388648 A1* | 12/2020 | Kuo ......................... H10B 61/20 |

* cited by examiner

*Primary Examiner* — Xia L Cross
(74) *Attorney, Agent, or Firm* — Winston Hsu

(57) ABSTRACT

A method of forming a semiconductor memory device is disclosed. A top electrode layer is formed on the MTJ stack layer. A patterned buffer layer is formed to cover only the logic circuit region. A hard mask layer is formed on the top electrode layer and the patterned buffer layer. A patterned resist layer is formed on the hard mask layer. A first etching process is performed to etch the hard mask layer and the top electrode layer not covered by the patterned resist layer in the memory region and the hard mask layer, the patterned buffer layer and the top electrode layer in the logic circuit region, thereby forming a top electrode on the MTJ stack layer in the memory region and a remaining top electrode layer covering only the logic circuit region on the MTJ stack layer.

19 Claims, 14 Drawing Sheets

METHOD OF FORMING A SEMICONDUCTOR MEMORY DEVICE WITH REMAINING UPPER ELECTRODE LAYER COVERING ONLY LOGIC CIRCUIT REGION ON MAGNETIC TUNNELING JUNCTION STACK LAYER

BACKGROUND OF THE INVENTION

1. Field of the Invention

The present invention relates to the field of semiconductor technology, and particularly relates to a semiconductor memory device and a manufacturing method thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. The characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

It is one object of the present invention to provide a semiconductor device and a manufacturing method thereof to solve the above-mentioned shortcomings or deficiencies of the prior art.

One aspect of the invention provides a method of forming a semiconductor memory device. A substrate having a memory region and a logic circuit region is provided. A first interlayer dielectric layer is formed on the substrate. A second interlayer dielectric layer is then formed on the first interlayer dielectric layer. At least one via is disposed in the second interlayer dielectric layer within the memory region. A magnetic tunneling junction (MTJ) stack layer is formed on the at least one via and the second interlayer dielectric layer. A top electrode layer is formed on the MTJ stack layer. A patterned buffer layer is formed to cover only the logic circuit region. A hard mask layer is formed on the top electrode layer and the patterned buffer layer. A patterned resist layer is formed on the hard mask layer. A first etching process is performed to etch the hard mask layer and the top electrode layer not covered by the patterned resist layer in the memory region and the hard mask layer, the patterned buffer layer and the top electrode layer in the logic circuit region, thereby forming a top electrode on the MTJ stack layer in the memory region and a remaining top electrode layer covering only the logic circuit region on the MTJ stack layer.

According to some embodiments, the first interlayer dielectric layer comprises an ultra-low dielectric constant (ULK) dielectric layer.

According to some embodiments, an etch stop layer is formed between the first interlayer dielectric layer and the second interlayer dielectric layer.

According to some embodiments, the etch stop layer comprises a nitride-doped silicon carbide (NDC) layer.

According to some embodiments, the second interlayer dielectric layer is in direct contact with the etch stop layer.

According to some embodiments, the second interlayer dielectric layer comprises a TEOS-based oxide layer.

According to some embodiments, the at least one via is a tungsten via.

According to some embodiments, the top electrode has a thickness greater than that of the remaining top electrode layer covering only the logic circuit region on the MTJ stack layer.

According to some embodiments, the top electrode layer comprises titanium nitride, the patterned buffer layer is a silicon nitride layer, and the hard mask layer is a silicon oxide layer.

According to some embodiments, after the first etching process is performed, a second etching process is performed to etch the MTJ stack layer and the second interlayer dielectric layer not covered by the top electrode in the memory region and etch the remaining top electrode layer, the MTJ stack layer and the second interlayer dielectric layer in the logic circuit region.

Another aspect of the invention provides a method of forming a semiconductor memory device. A substrate having a memory region and a logic circuit region is provided. A first interlayer dielectric layer is formed on the substrate. A second interlayer dielectric layer is formed on the first interlayer dielectric layer. At least one via is formed in the second interlayer dielectric layer within the memory region. A magnetic tunneling junction (MTJ) stack layer is formed on the at least one via and the second interlayer dielectric layer. A top electrode layer is formed on the MTJ stack layer. The top electrode layer has a first thickness. The top electrode layer is partially removed from the memory region and the top electrode layer has a second thickness in the memory region. The second thickness is smaller than the first thickness. A step height is formed at an interface between the memory region and the logic circuit region. A hard mask layer is formed to cover the top electrode layer. A patterned resist layer is formed on the hard mask layer. A first etching process is performed to etch the hard mask layer and the top electrode layer not covered by the patterned resist layer in the memory region and the hard mask layer and the top electrode layer in the logic circuit region, thereby forming a top electrode on the MTJ stack layer in the memory region and a remaining top electrode layer covering only the logic circuit region on the MTJ stack layer.

According to some embodiments, the first interlayer dielectric layer comprises an ultra-low dielectric constant (ULK) dielectric layer.

According to some embodiments, an etch stop layer between the first interlayer dielectric layer and the second interlayer dielectric layer.

According to some embodiments, the etch stop layer comprises a nitride-doped silicon carbide (NDC) layer.

According to some embodiments, the second interlayer dielectric layer is in direct contact with the etch stop layer.

According to some embodiments, the second interlayer dielectric layer comprises a TEOS-based oxide layer.

According to some embodiments, the at least one via is a tungsten via.

According to some embodiments, the first thickness is about 900~1200 angstroms, and the second thickness is about 500~700 angstroms.

According to some embodiments, the top electrode layer comprises titanium nitride, and the hard mask layer is a silicon oxide layer.

According to some embodiments, after the first etching process is performed, a second etching process is performed to etch the MTJ stack layer and the second interlayer dielectric layer not covered by the top electrode in the memory region and etch the remaining top electrode layer, the MTJ stack layer and the second interlayer dielectric layer in the logic circuit region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
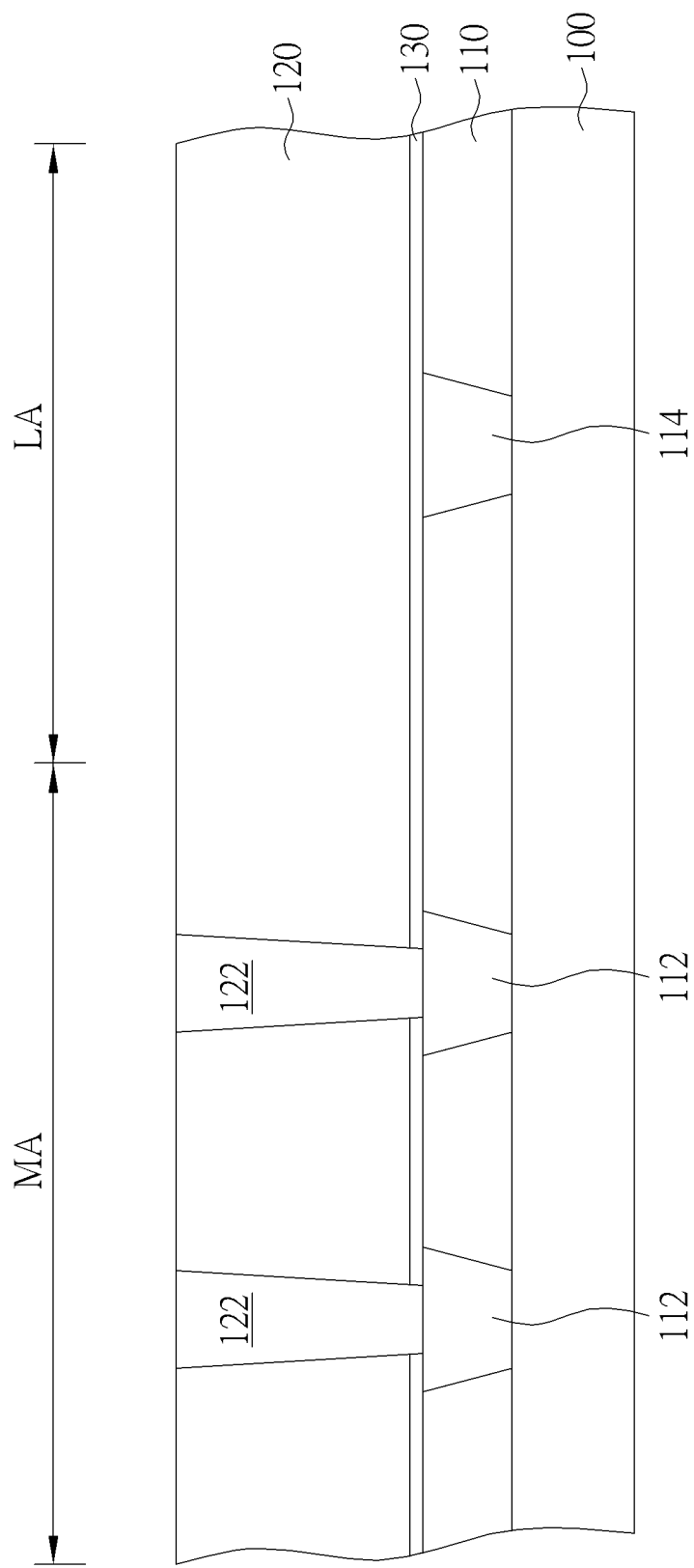
FIG. 1 to FIG. 7 are schematic diagrams illustrating a method of forming a semiconductor memory device according to an embodiment of the present invention.

Please refer to FIG. 1 to FIG. 7, which are schematic diagrams of a method of forming a semiconductor memory device according to an embodiment of the present invention. As shown in FIG. 1, first, a substrate 100 is provided. For example, the substrate 100 may be a silicon substrate, but is not limited thereto. According to an embodiment of the present invention, the substrate 100 includes a memory region MA and a logic circuit region LA. Then, a first interlayer dielectric layer 110 is formed on the substrate 100. According to an embodiment of the present invention, the first interlayer dielectric layer 110 may include an ultra-low dielectric constant (ULK) dielectric layer. For example, the dielectric constant of the ULK dielectric layer may be less than 2.5, but is not limited thereto. According to an embodiment of the present invention, metal interconnection layers 112 and 114 may be formed in the first interlayer dielectric layer 110. The metal interconnection layer 112 is located in the memory region MA, and the metal interconnection layer 114 is located in the logic circuit region LA.

Subsequently, a chemical vapor deposition (CVD) method may be performed to deposit a second interlayer dielectric layer 120 on the first interlayer dielectric layer 110. According to an embodiment of the present invention, for example, the second interlayer dielectric layer 120 may include a tetraethoxysilane (TEOS)-based oxide layer, but is not limited thereto. According to an embodiment of the present invention, an etch stop layer 130 may be formed between the first interlayer dielectric layer 110 and the second interlayer dielectric layer 120. According to an embodiment of the present invention, for example, the etch stop layer 130 may include a nitrogen-doped silicon carbide (NDC) layer. According to an embodiment of the present invention, the second interlayer dielectric layer 120 is in direct contact with the etch stop layer 130.

At least one via 122 is formed in the second interlayer dielectric layer 120 in the memory region MA. According to an embodiment of the present invention, the via 122 may be a tungsten via. According to an embodiment of the present invention, the via 122 is electrically connected to the underlying metal interconnection layer 112. The formation of the vias 122 is a well-known technique, so the details will not be repeated. For example, a photolithography process and an etching process can be used to form openings in the second interlayer dielectric layer 120 and the etch stop layer 130, and then the openings are filled with a tungsten metal layer, and then a chemical mechanical polishing (CMP) process is performed to polish away excess tungsten metal layer outside the hole.

Figure 2:
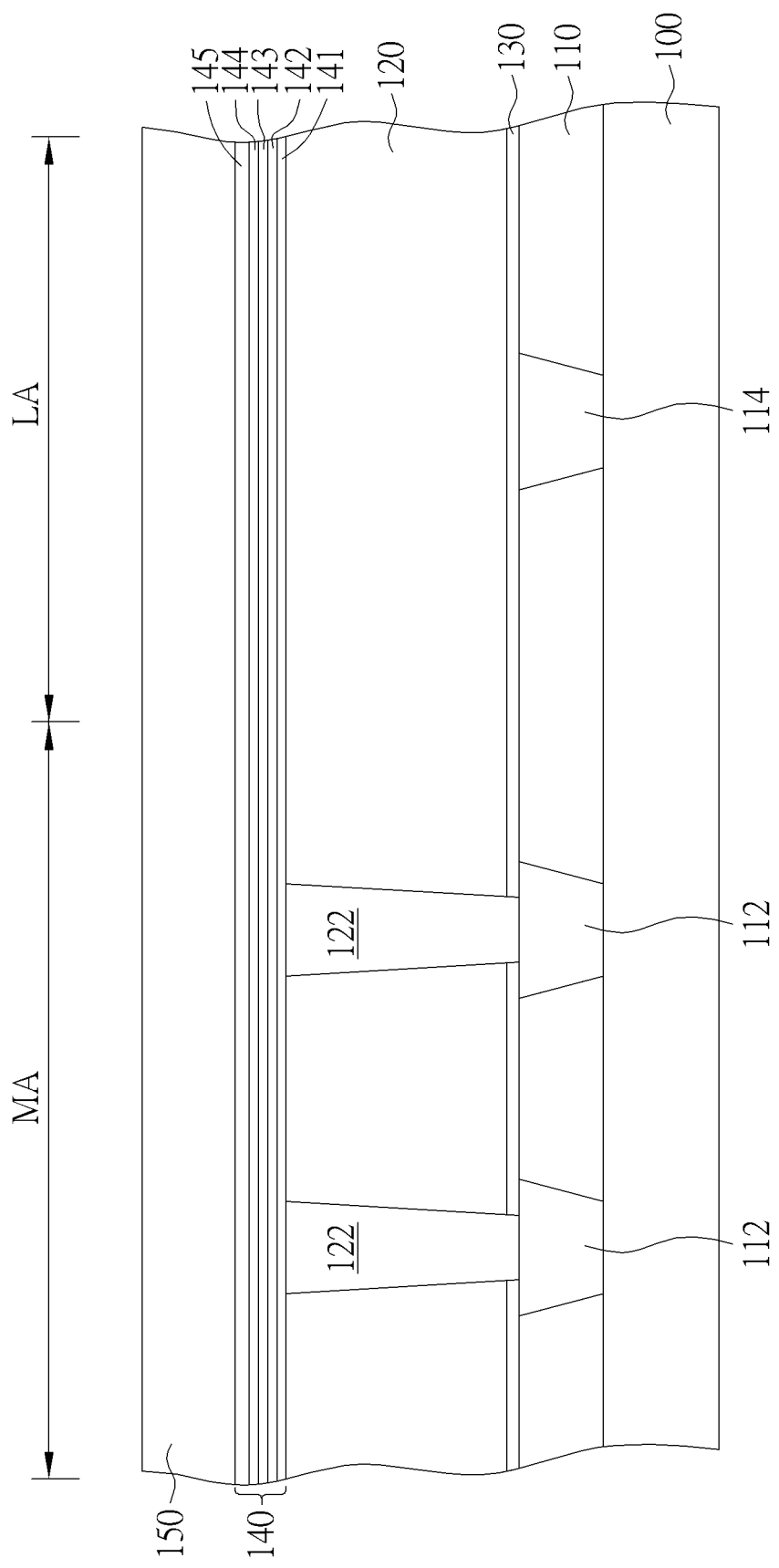

As shown in FIG. 2, a magnetic tunnel junction (MTJ) stack layer 140 is then formed on the via 122 and the second interlayer dielectric layer 120. According to an embodiment of the present invention, for example, the MTJ stack layer 140 may include a lower electrode layer 141, a reference layer 142, a tunnel barrier layer 143, a free layer 144, and a cap layer 145. The reference layer 142 and the free layer 144 may be made of ferromagnetic materials, and the tunnel barrier layer 143 may be made of insulating materials, but not limited thereto. Next, an upper electrode layer 150 is formed on the MTJ stack layer 140. According to an embodiment of the present invention, the upper electrode layer 150 may include titanium nitride, but is not limited thereto.

Figure 3:
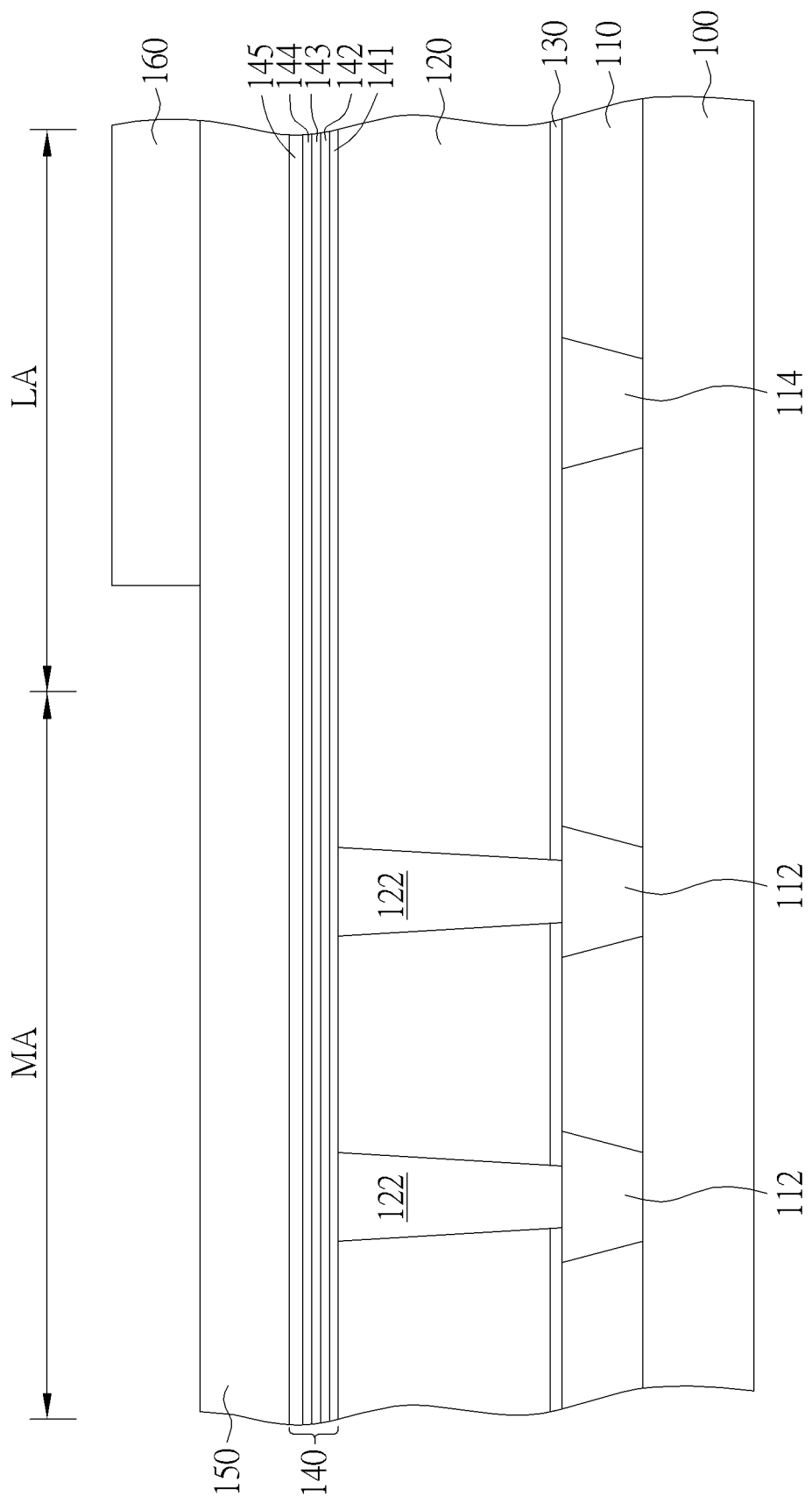

As shown in FIG. 3, a patterned buffer layer 160 covering only the logic circuit region LA is then formed. According to an embodiment of the present invention, the patterned buffer layer 160 may be a silicon nitride layer, but is not limited thereto. At this point, the upper electrode layer 150 in the memory region MA is exposed.

Figure 4:
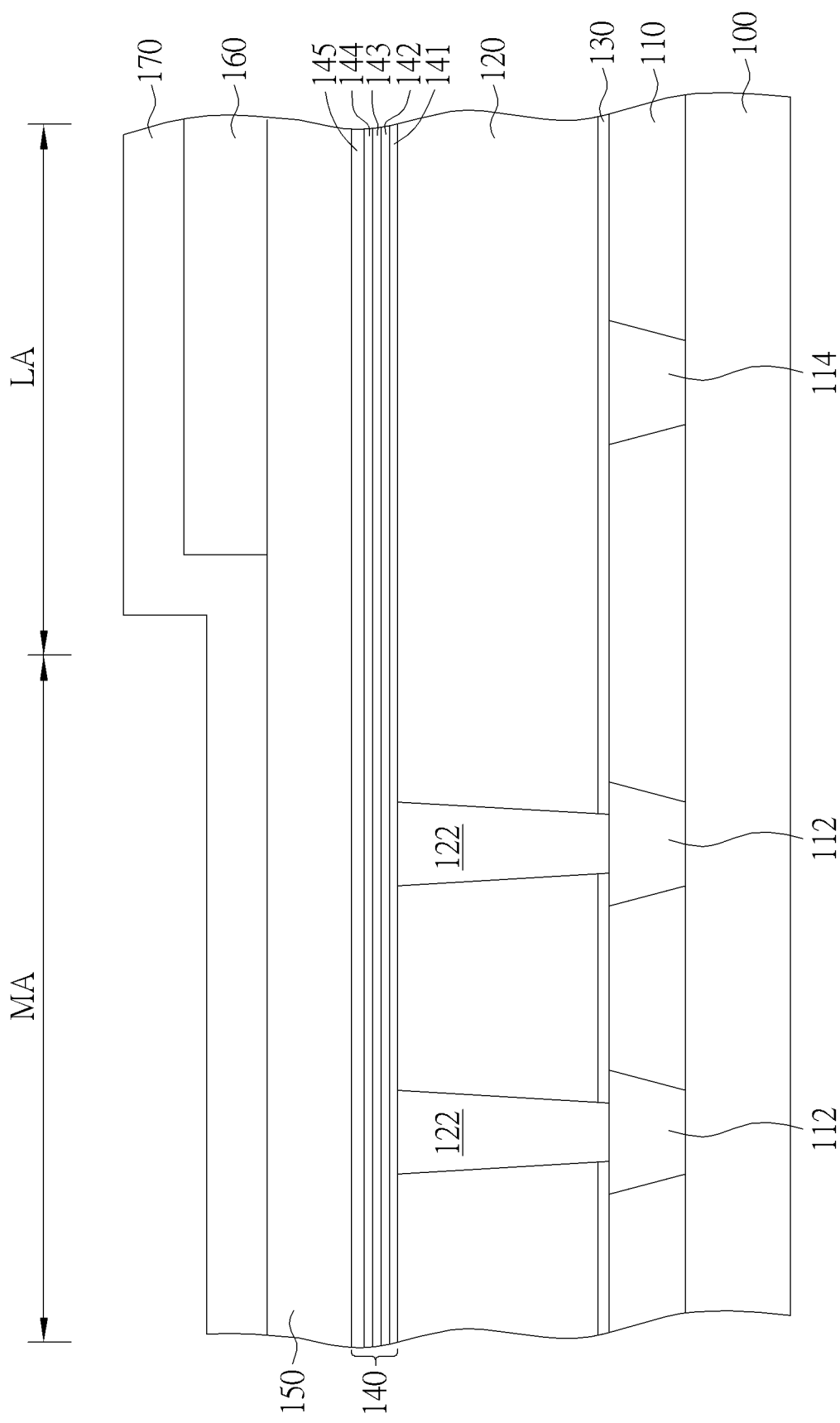

As shown in FIG. 4, a hard mask layer 170 is then formed on the upper electrode layer 150 and the patterned buffer layer 160. According to an embodiment of the present invention, the hard mask layer 170 may be a silicon oxide layer, but is not limited thereto.

Figure 5:
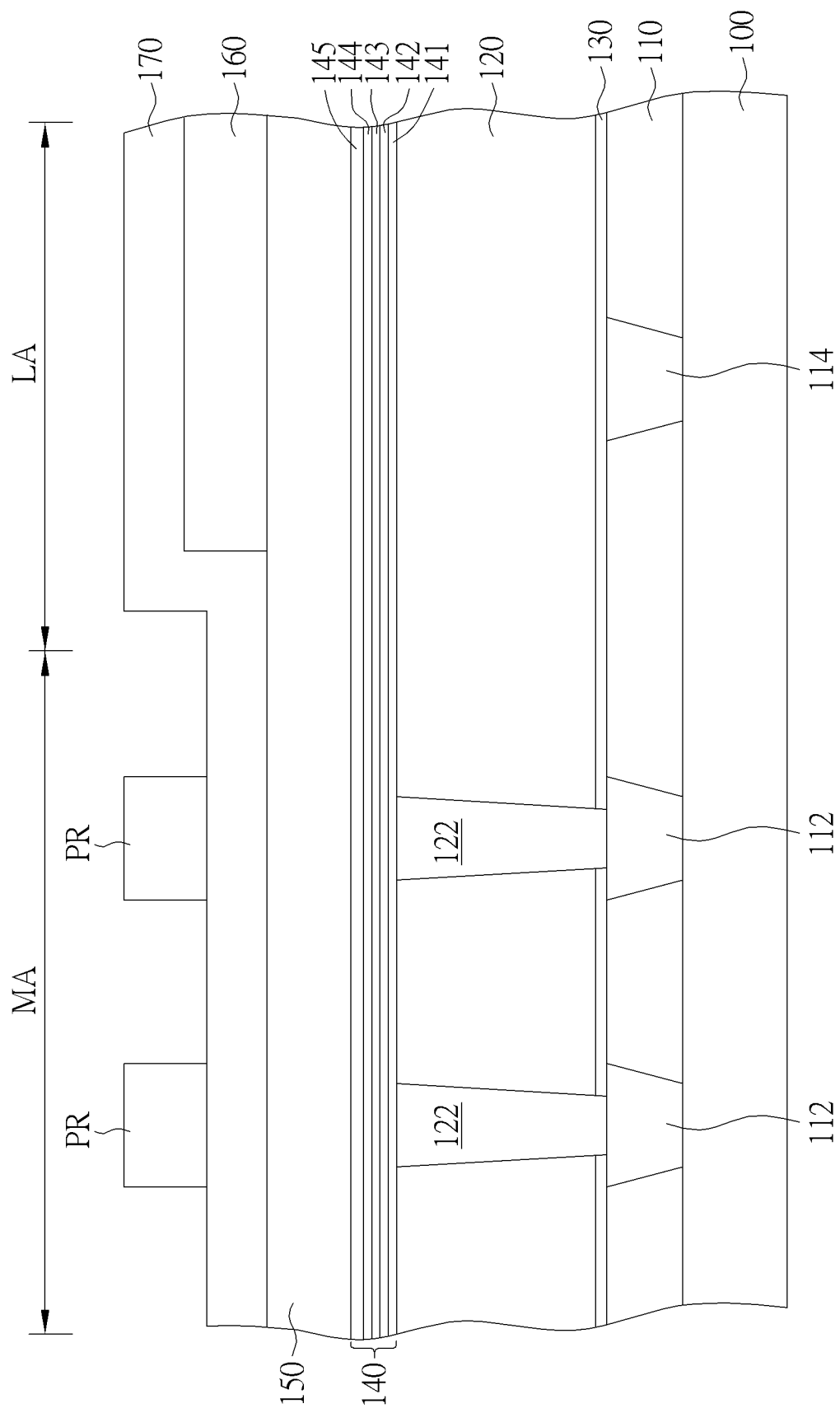

As shown in FIG. 5, a patterned resist layer PR is then formed on the hard mask layer 170. According to an embodiment of the present invention, the patterned resist layer PR is formed on the hard mask layer 170 and is formed only in the memory region MA. According to an embodiment of the present invention, the patterned resist layer PR defines the position and pattern of the memory cells to be formed on the vias 122.

Figure 6:
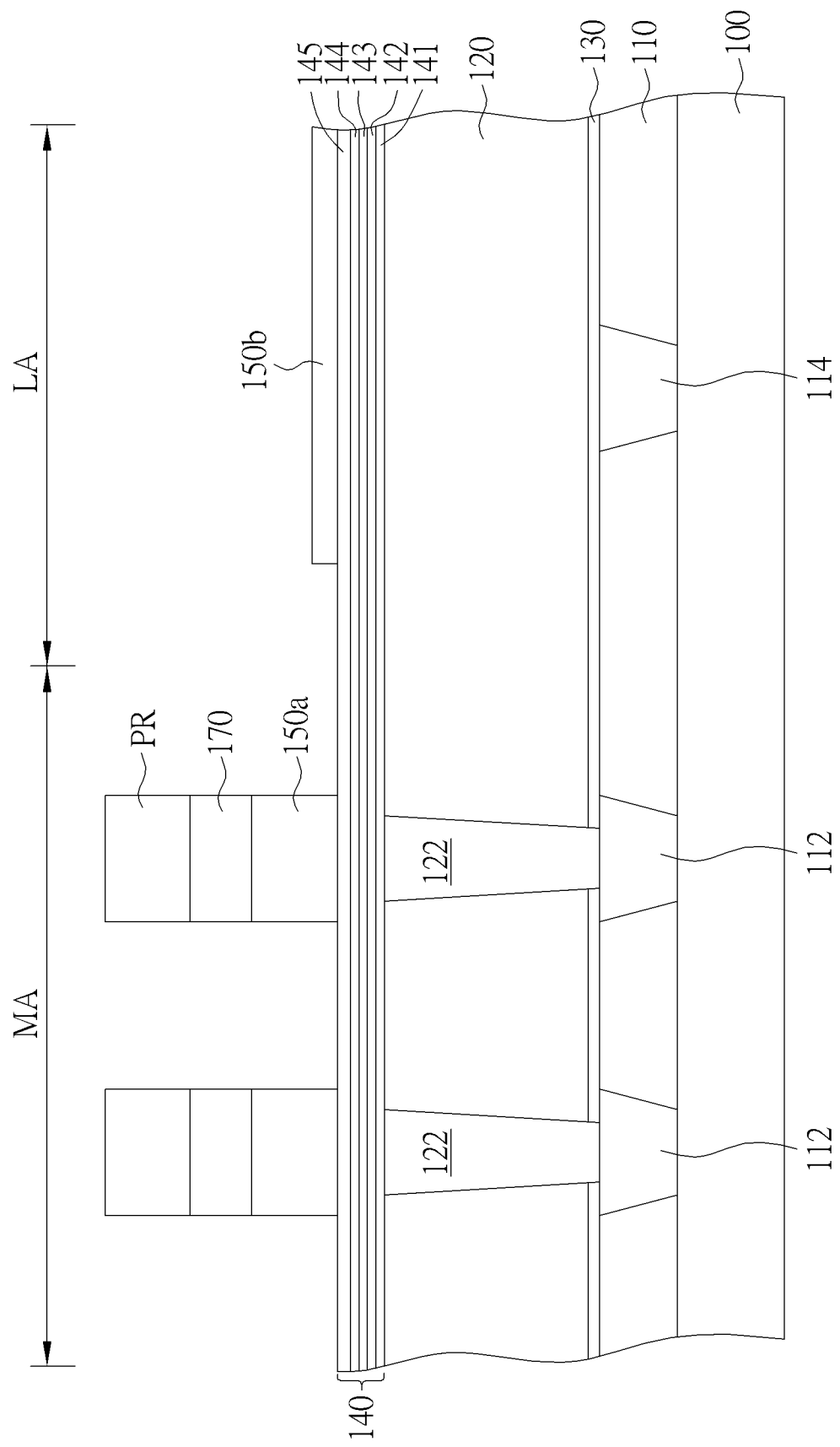

As shown in FIG. 6, a first etching process, such as an anisotropic dry etching process, is performed to etch the hard mask layer 170 and the upper electrode layer 150 that are not covered by the patterned resist layer PR in the memory region MA, and etch the hard mask layer 170, the patterned buffer layer 160, and the upper electrode layer 150 in the logic circuit region LA, thereby forming the upper electrode 150a on the MTJ stack layer 140 in the memory region MA and the remaining upper electrode layer 150b that is located on the MTJ stack layer 140 and masks only the logic circuit region LA.

According to an embodiment of the present invention, the thickness of the upper electrode 150a is greater than the thickness of the remaining upper electrode layer 150b that is located on the MTJ stack layer 140 and masks only the logic circuit region LA. According to an embodiment of the present invention, for example, the thickness of the remaining upper electrode layer 150b is about 600 angstroms.

Figure 7:
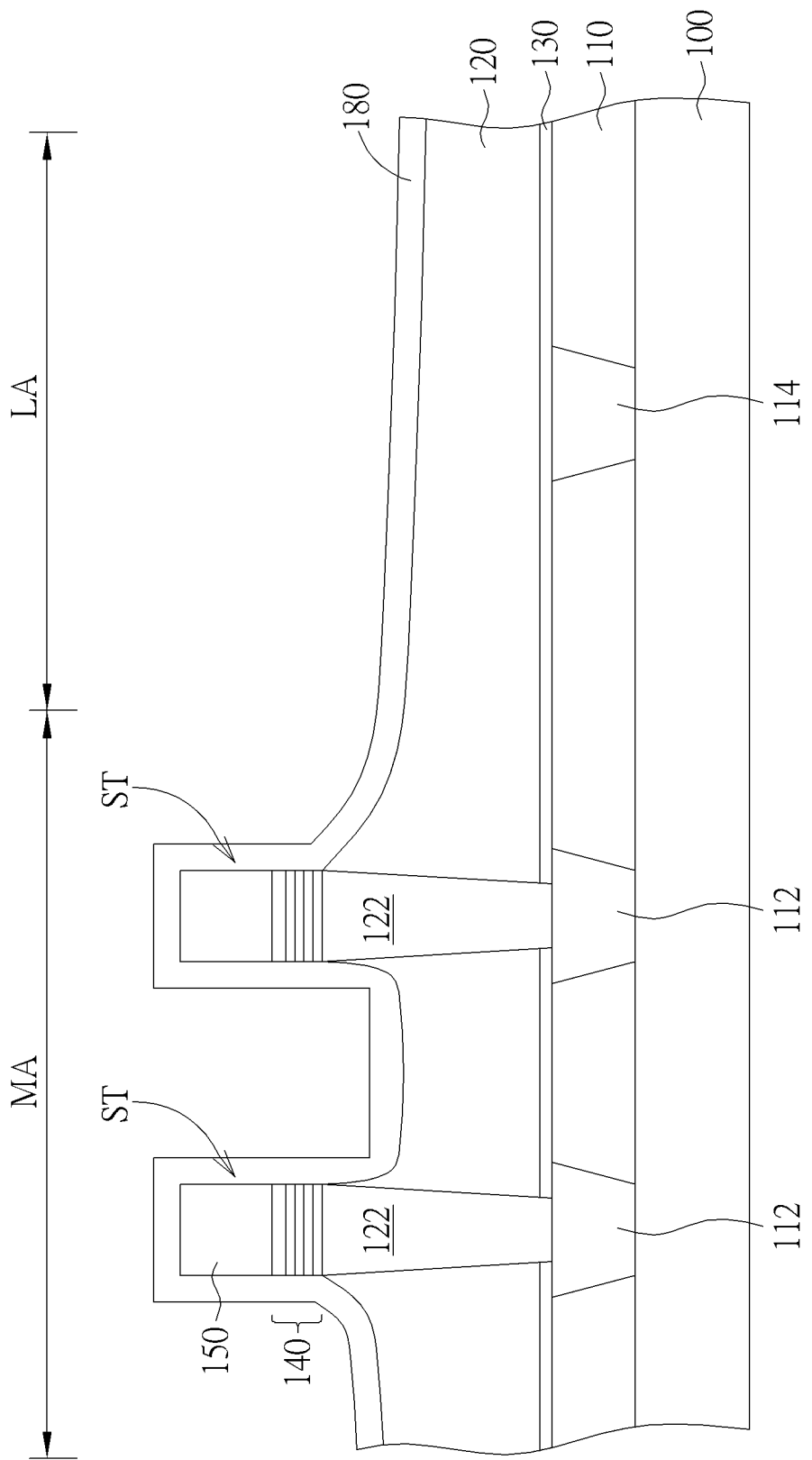

As shown in FIG. 7, after the first etching process is performed, a second etching process such as ion beam etching is then performed to etch the MTJ stack layer 140 and the second interlayer dielectric layer 120 in the memory region MA that is not covered by the upper electrode 150a, and etch the remaining upper electrode layer 150b, the MTJ stack layer 140 and the second interlayer dielectric layer 120 in the logic circuit region LA, thereby forming storage units ST in the memory region MA. Subsequently, a protective layer 180 may be conformally deposited on the storage units ST. For example, the protective layer 180 may be a silicon nitride layer.

According to the present invention, the remaining upper electrode layer 150b is formed on the MTJ stack layer 140, which masks only the logic circuit region LA to reduce the consumption of the second interlayer dielectric layer 120 during the second etching process. Therefore, after the second etching process is completed, the thickness difference between the second interlayer dielectric layer 120 in the logic circuit region LA and the second interlayer dielectric layer 120 in the memory region MA is reduced.

Figure 8:
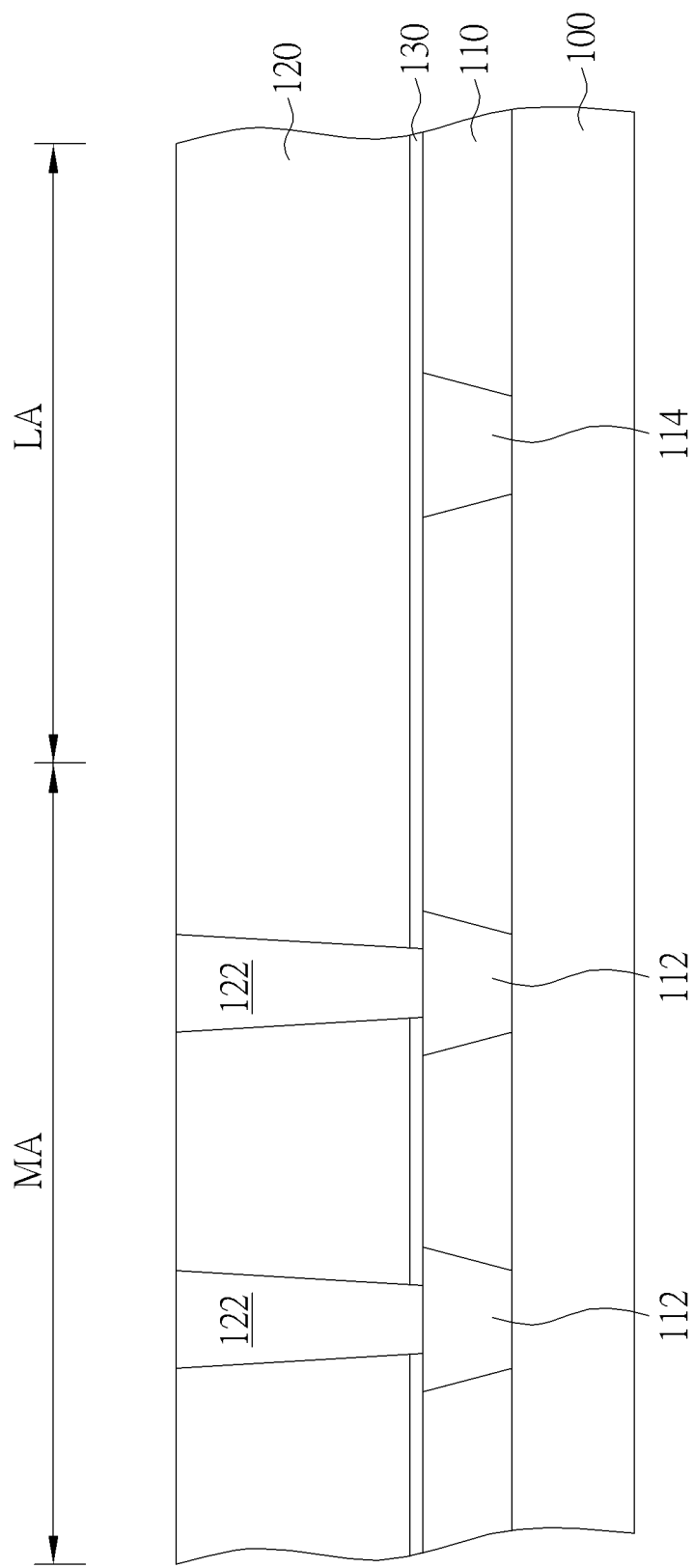
FIG. 8 to FIG. 14 are schematic diagrams illustrating a method of forming a semiconductor memory device according to another embodiment of the present invention.

Please refer to FIG. 8 to FIG. 14, which are schematic diagrams of a method of forming a semiconductor memory device according to another embodiment of the present invention. As shown in FIG. 8, a substrate 100 such as a silicon substrate is provided. According to an embodiment of the present invention, the substrate 100 includes a memory region MA and a logic circuit region LA. A first interlayer dielectric layer 110 is formed on the substrate 100. According to an embodiment of the present invention, the first interlayer dielectric layer 110 may include an ultra-low dielectric constant (ULK) dielectric layer. For example, the dielectric constant of the ULK dielectric layer may be less than 2.5, but is not limited thereto. According to an embodiment of the present invention, metal interconnection layers 112 and 114 may be formed in the first interlayer dielectric layer 110. The metal interconnection layer 112 is located in the memory region MA, and the metal interconnection layer 114 is located in the logic circuit region LA.

A CVD method can be used to deposit a second interlayer dielectric layer 120 on the first interlayer dielectric layer 110. According to an embodiment of the present invention, for example, the second interlayer dielectric layer 120 may include a TEOS-based oxide layer, but is not limited thereto. According to an embodiment of the present invention, an etch stop layer 130 may be formed between the first interlayer dielectric layer and the second interlayer dielectric layer. According to an embodiment of the present invention, for example, the etch stop layer 130 may include a nitrogen-doped silicon carbide layer. According to an embodiment of the present invention, the second interlayer dielectric layer 120 is in direct contact with the etch stop layer 130.

At least one via 122 is then formed in the second interlayer dielectric layer 120 in the memory region MA. According to an embodiment of the present invention, the via 122 may be a tungsten via. According to an embodiment of the present invention, the via 122 is electrically connected to the underlying metal interconnection layer 112. The formation of the vias 122 is a well-known technique, so the details will not be repeated. For example, a photolithography process and an etching process can be used to form openings in the second interlayer dielectric layer 120 and the etch stop layer 130, and the openings are filled with a tungsten metal layer, and then a CMP process is performed to polish away excess tungsten metal layer outside the openings.

Figure 9:
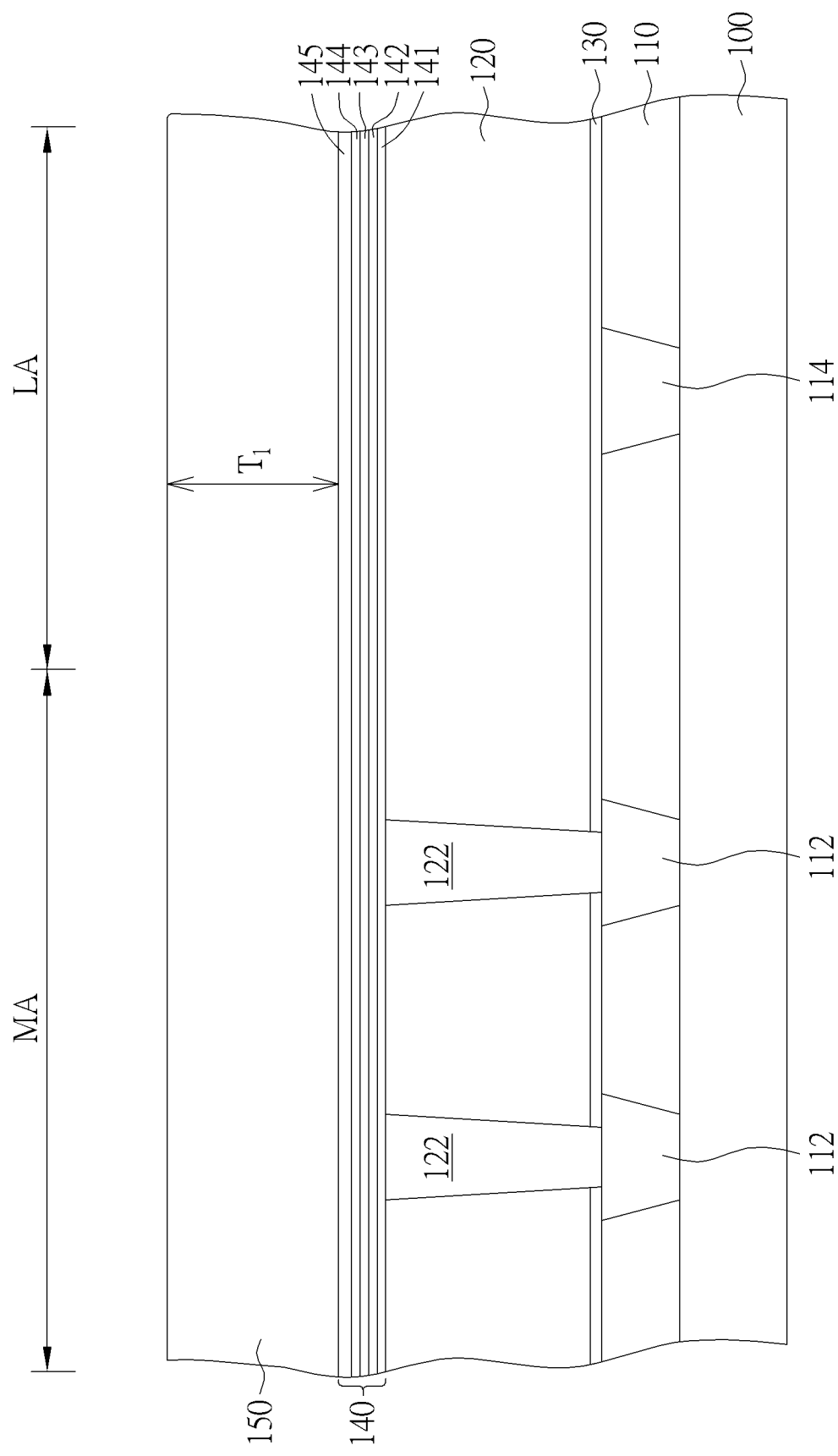

As shown in FIG. 9, a MTJ stack layer 140 is then formed on the vias 122 and the second interlayer dielectric layer 120. According to an embodiment of the present invention, for example, the MTJ stack layer 140 may include a lower electrode layer 141, a reference layer 142, a tunnel barrier layer 143, a free layer 144, and a cap layer 145. The reference layer 142 and the free layer 144 may be made of ferromagnetic material, and the tunnel barrier layer 143 may be made of an insulating material, but is not limited thereto. Next, an upper electrode layer 150 is formed on the MTJ stack layer 140. According to an embodiment of the present invention, the upper electrode layer 150 may include titanium nitride, but is not limited thereto. The upper electrode layer 150 has a first thickness $t_1$. For example, the first thickness $t_1$ is between 900-1200 angstroms, for example, about 1000 angstroms, but is not limited thereto.

Figure 10:
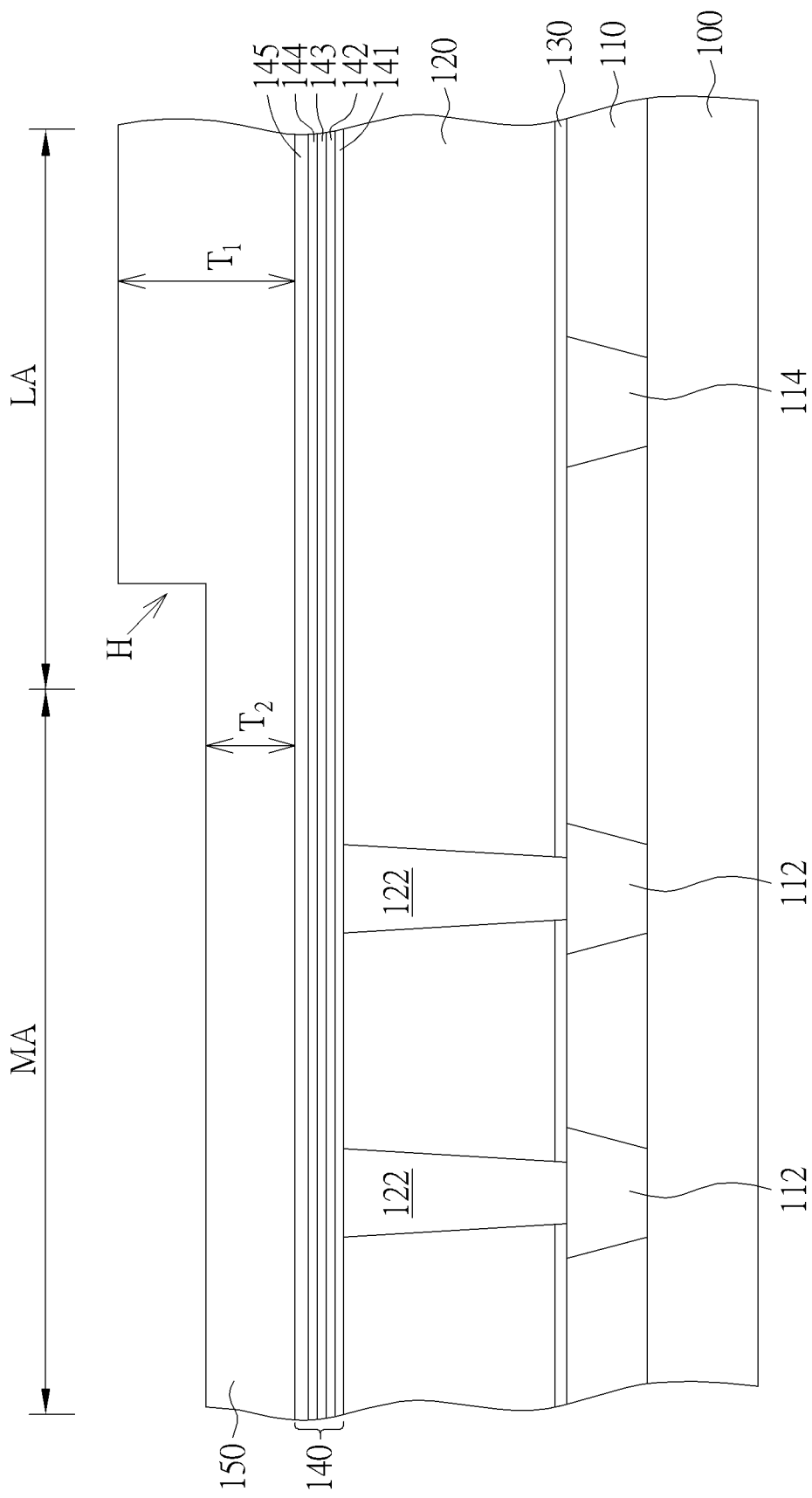

As shown in FIG. 10, a lithography process and an etching process are then performed to partially remove the upper electrode layer 150 from the memory region MA and the upper electrode layer 150 has a second thickness $t_2$ in the memory region MA. The second thickness $t_2$ is smaller than the first thickness $t_1$, thereby forming a step height H at the interface between the memory region MA and the logic circuit region LA. For example, the second thickness $t_2$ is between 500-700 angstroms, for example, about 600 angstroms, but is not limited thereto.

Figure 11:
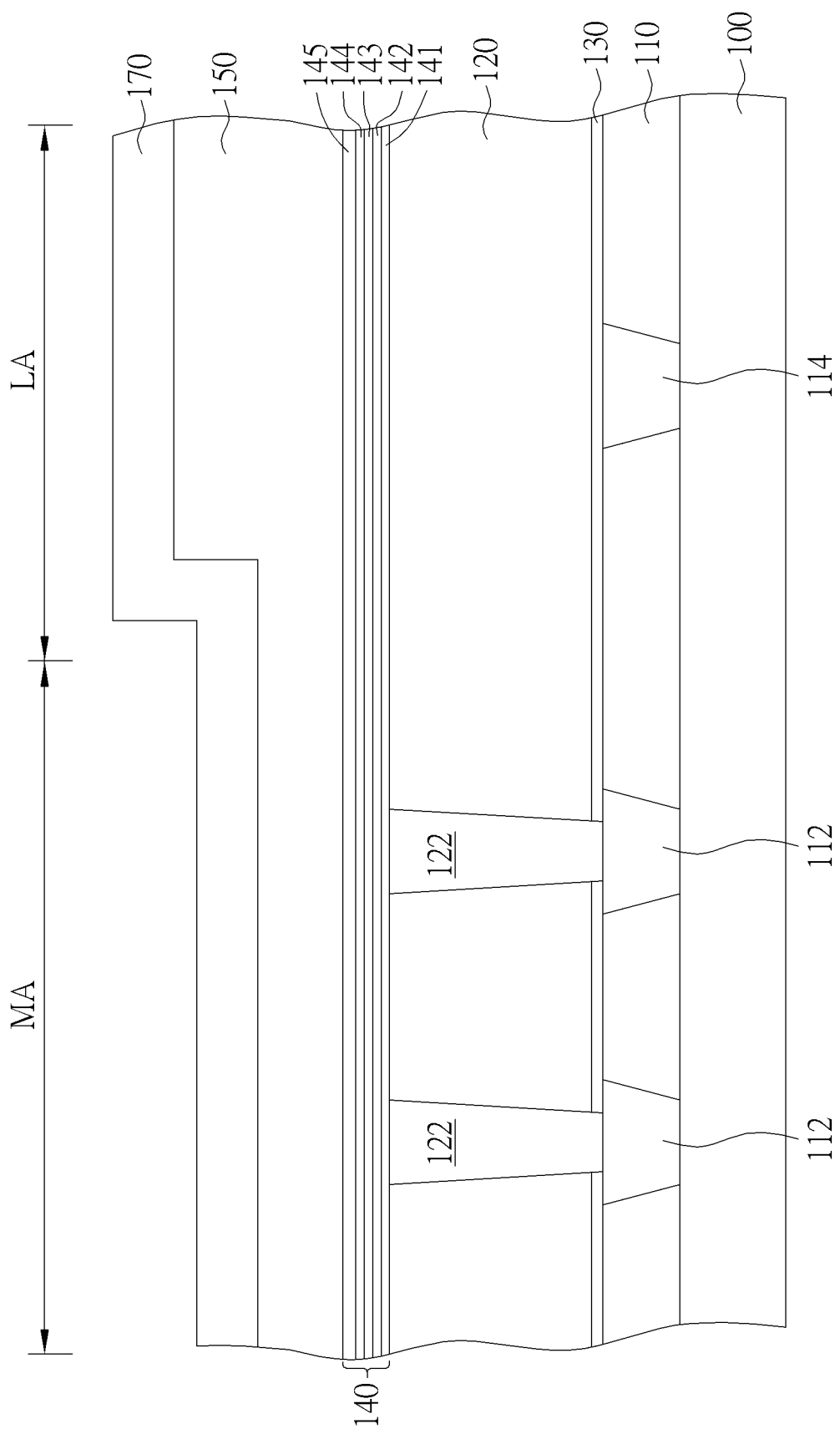

As shown in FIG. 11, a hard mask layer 170 covering the upper electrode layer 150 is then formed. According to an embodiment of the present invention, the hard mask layer 170 may be a silicon oxide layer, but is not limited thereto.

Figure 12:
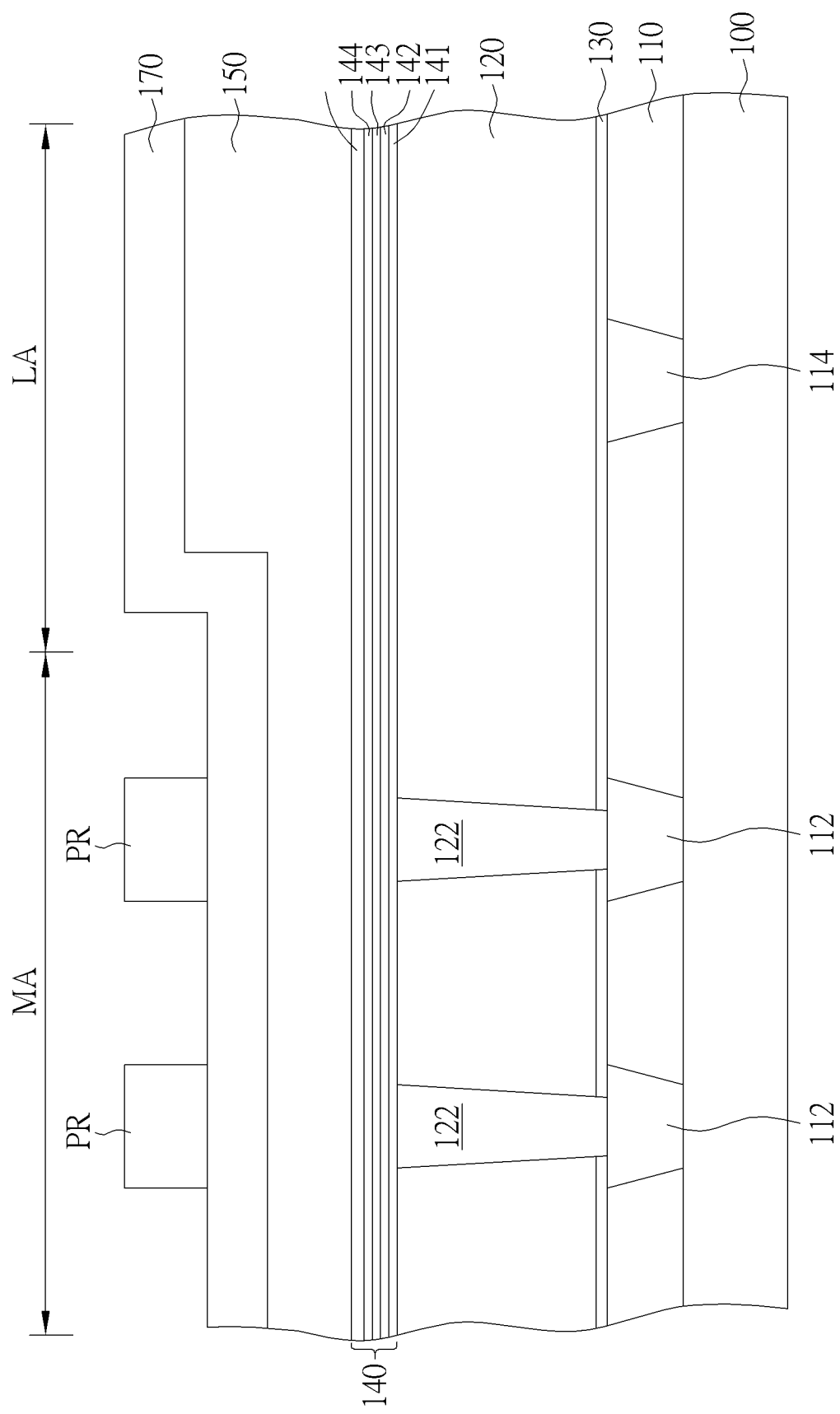

As shown in FIG. 12, a patterned resist layer PR is formed on the hard mask layer 170. According to an embodiment of the present invention, the patterned resist layer PR is formed on the hard mask layer 170 and is formed only in the memory region MA. According to an embodiment of the present invention, the patterned resist layer PR defines the position and pattern of the memory cells to be formed on the vias 122.

Figure 13:
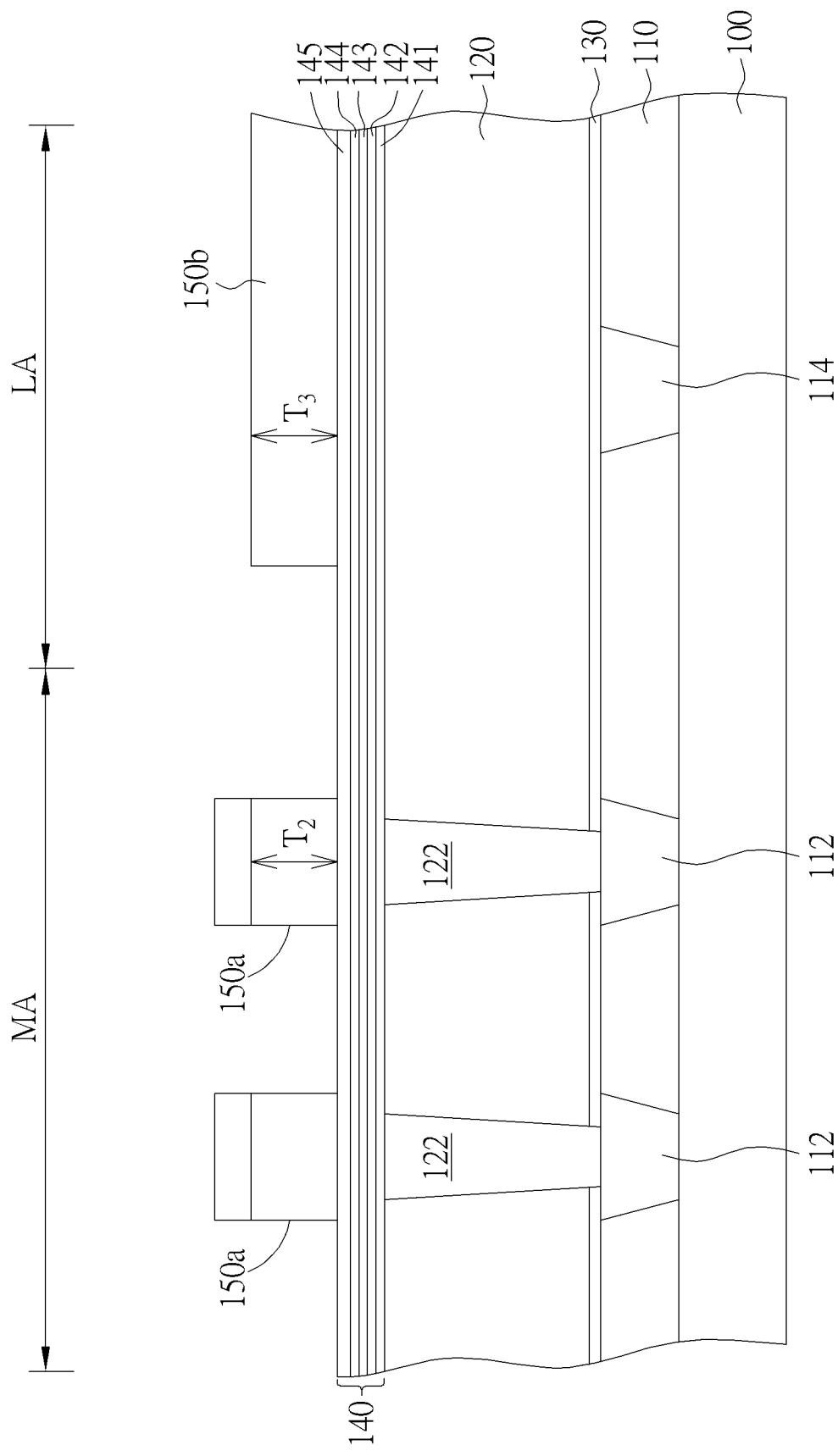

As shown in FIG. 13, a first etching process, for example, an anisotropic dry etching process, is performed to etch the hard mask layer 170 and the upper electrode layer that are not covered by the patterned resist layer PR in the memory region MA 150, and etch the hard mask layer 170 and the upper electrode layer 150 in the logic circuit region LA, thereby forming the upper electrode 150a on the MTJ stack layer 140 in the memory region MA and the remaining upper electrode layer 150b that only masks the logic circuit region LA on the MTJ stack layer 140. According to an embodiment of the present invention, the remaining upper electrode layer 150b has a third thickness $t_3$, wherein the third thickness $t_3$ is less than or equal to the first thickness $t_1$.

Figure 14:
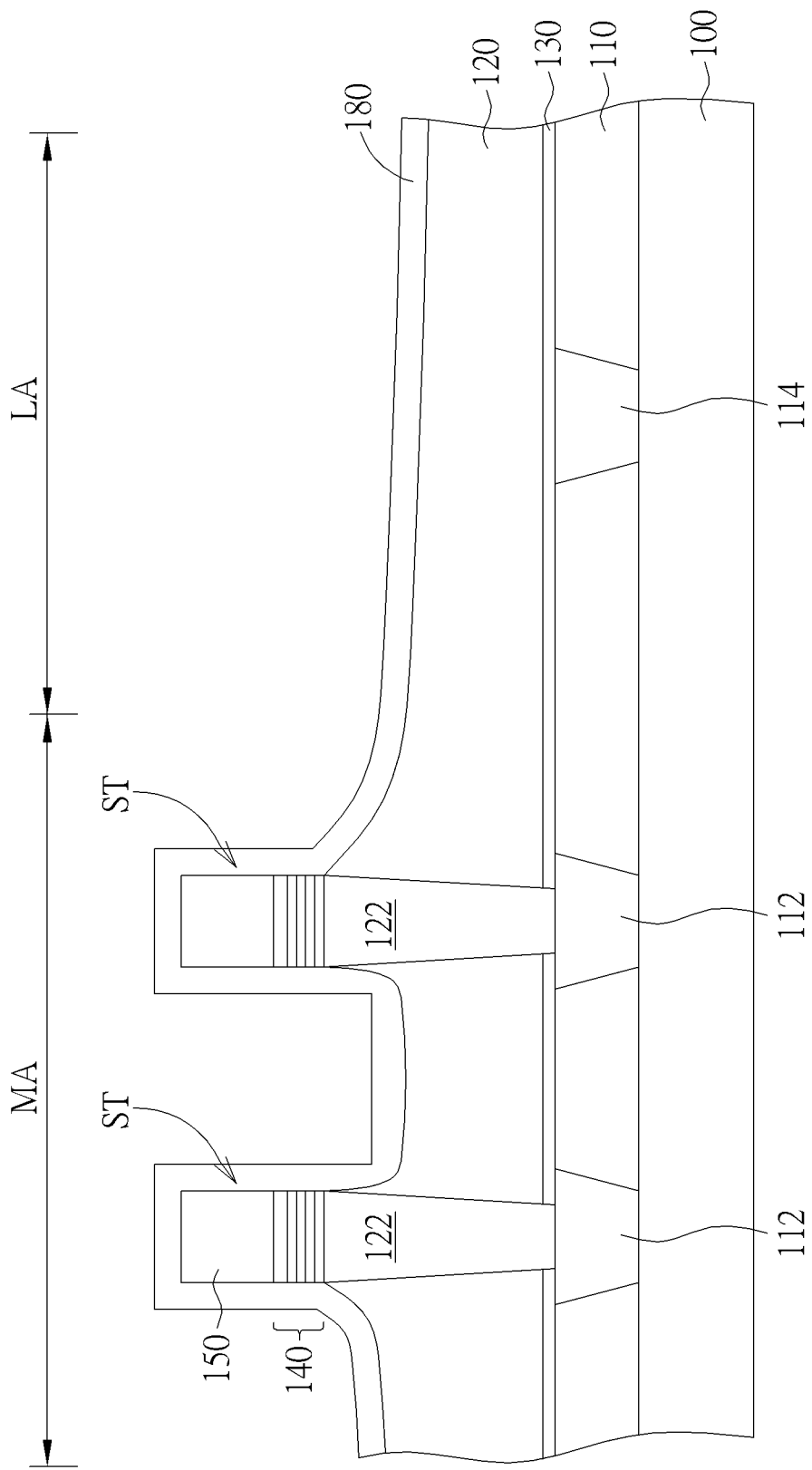

As shown in FIG. 14, after the first etching process is performed, a second etching process, for example, ion beam etching, is subsequently performed to etch the MTJ stack layer 140 and the second interlayer dielectric layer 120 in the memory region MA that is not covered by the upper electrode 150a, and etch the remaining upper electrode layer 150b, the MTJ stack layer 140 and the second interlayer dielectric layer 120 in the logic circuit region LA, thereby forming storage units ST in the memory region MA. Next, a protective layer 180 may be conformally deposited on the storage units ST. For example, the protective layer 180 may be a silicon nitride layer.

According to the embodiment of the present invention, the thicker remaining upper electrode layer 150b is formed on the logic circuit region LA to reduce the consumption of the second interlayer dielectric layer 120 during the second etching process. Therefore, after the second etching process is completed, the thickness difference between the second interlayer dielectric layer 120 in the logic circuit region LA and the second interlayer dielectric layer 120 in the memory region MA is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
   providing a substrate comprising a memory region and a logic circuit region;
   forming a first interlayer dielectric layer on the substrate;
   forming a second interlayer dielectric layer on the first interlayer dielectric layer;
   forming at least one via in the second interlayer dielectric layer within the memory region;
   forming a magnetic tunneling junction (MTJ) stack layer on the at least one via and the second interlayer dielectric layer;
   forming a top electrode layer on the MTJ stack layer;
   forming a patterned buffer layer covering only the logic circuit region;
   forming a hard mask layer on the top electrode layer and the patterned buffer layer;
   forming a patterned resist layer on the hard mask layer; and
   performing a first etching process to etch the hard mask layer and the top electrode layer not covered by the patterned resist layer in the memory region and the hard mask layer, the patterned buffer layer and the top electrode layer in the logic circuit region, thereby forming a top electrode on the MTJ stack layer in the memory region and a remaining top electrode layer covering only the logic circuit region on the MTJ stack layer.

2. The method according to claim 1, wherein the first interlayer dielectric layer comprises an ultra-low dielectric constant (ULK) dielectric layer.

3. The method according to claim 1 further comprising:
   an etch stop layer between the first interlayer dielectric layer and the second interlayer dielectric layer.

4. The method according to claim 3, wherein the etch stop layer comprises a nitride-doped silicon carbide (NDC) layer.

5. The method according to claim 4, wherein the second interlayer dielectric layer is in direct contact with the etch stop layer.

6. The method according to claim 1, wherein the second interlayer dielectric layer comprises a TEOS-based oxide layer.

7. The method according to claim 1, wherein the at least one via is a tungsten via.

8. The method according to claim 1, wherein the top electrode has a thickness greater than that of the remaining top electrode layer covering only the logic circuit region on the MTJ stack layer.

9. The method according to claim 1, wherein the top electrode layer comprises titanium nitride, the patterned buffer layer is a silicon nitride layer, and the hard mask layer is a silicon oxide layer.

10. The method according to claim 1, wherein after the first etching process is performed, the method further comprises:
    performing a second etching process to etch the MTJ stack layer and the second interlayer dielectric layer not covered by the top electrode in the memory region and etch the remaining top electrode layer, the MTJ stack layer and the second interlayer dielectric layer in the logic circuit region.

11. A method of forming a semiconductor memory device, comprising:
    providing a substrate comprising a memory region and a logic circuit region;
    forming a first interlayer dielectric layer on the substrate;
    forming a second interlayer dielectric layer on the first interlayer dielectric layer;
    forming at least one via in the second interlayer dielectric layer within the memory region;
    forming a magnetic tunneling junction (MTJ) stack layer on the at least one via and the second interlayer dielectric layer;
    forming a top electrode layer on the MTJ stack layer, wherein the top electrode layer has a first thickness;
    partially removing the top electrode layer from the memory region, wherein the top electrode layer has a second thickness in the memory region, wherein the second thickness is smaller than the first thickness, thereby forming a step height at an interface between the memory region and the logic circuit region;
    forming a hard mask layer covering the top electrode layer;
    forming a patterned resist layer on the hard mask layer; and
    performing a first etching process to etch the hard mask layer and the top electrode layer not covered by the patterned resist layer in the memory region and the hard mask layer and the top electrode layer in the logic circuit region, thereby forming a top electrode on the MTJ stack layer in the memory region and a remaining top electrode layer covering only the logic circuit region on the MTJ stack layer; and
    performing a second etching process to etch the MTJ stack layer and the second interlayer dielectric layer not covered by the top electrode in the memory region and etch the remaining top electrode layer, the MTJ stack layer and the second interlayer dielectric layer in the logic circuit region.

12. The method according to claim 11, wherein the first interlayer dielectric layer comprises an ultra-low dielectric constant (ULK) dielectric layer.

13. The method according to claim 11 further comprising:
    an etch stop layer between the first interlayer dielectric layer and the second interlayer dielectric layer.

14. The method according to claim 13, wherein the etch stop layer comprises a nitride-doped silicon carbide (NDC) layer.

15. The method according to claim 14, wherein the second interlayer dielectric layer is in direct contact with the etch stop layer.

16. The method according to claim 11, wherein the second interlayer dielectric layer comprises a TEOS-based oxide layer.

17. The method according to claim 11, wherein the at least one via is a tungsten via.

18. The method according to claim 11, wherein the first thickness is about 900~1200 angstroms, and the second thickness is about 500~700 angstroms.

19. The method according to claim 11, wherein the top electrode layer comprises titanium nitride and the hard mask layer is a silicon oxide layer.

\* \* \* \* \*